United States Patent
Golat et al.

(10) Patent No.: US 12,052,003 B2
(45) Date of Patent: Jul. 30, 2024

(54) SOURCE SWITCH SPLIT LNA DESIGN WITH THIN CASCODES AND HIGH SUPPLY VOLTAGE

(71) Applicant: pSemi Corporation, San Diego, CA (US)

(72) Inventors: Joseph Golat, Crystal Lake, IL (US); David Kovac, Arlington Heights, IL (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 18/168,064

(22) Filed: Feb. 13, 2023

(65) Prior Publication Data

US 2023/0253933 A1  Aug. 10, 2023

Related U.S. Application Data (63) Continuation of application No. 17/128,864, filed on Dec. 21, 2020, now Pat. No. 11,588,447.

(51) Int. Cl.
  *H03F 1/22* (2006.01)
  *H03F 3/193* (2006.01)

(52) U.S. Cl.
  CPC ....... *H03F 3/193* (2013.01); *H03F 2200/294* (2013.01); *H03F 2200/451* (2013.01)

(58) Field of Classification Search
  CPC .................................... H03F 1/22; H03F 3/21
  USPC .................................................. 330/311, 310
  See application file for complete search history.

(56) References Cited

U.S. PATENT DOCUMENTS

| | | | | |
|---|---|---|---|---|
| 7,113,744 B1* | 9/2006 | Moloudi | ............ | H03H 21/0012 330/253 |
| 8,031,005 B2* | 10/2011 | Xiong | ....................... | H03F 3/72 330/311 |
| 8,279,008 B2* | 10/2012 | Hsieh | ...................... | H03F 1/223 330/285 |
| 8,427,240 B2* | 4/2013 | Hsieh | ...................... | H03F 1/223 330/311 |
| 9,035,697 B2* | 5/2015 | Youssef | ................ | H03F 1/3205 330/311 |
| 9,407,226 B2 | 8/2016 | Liao | | |

(Continued)

OTHER PUBLICATIONS

Choe, Henry, Office Action received from the USPTO dated Aug. 4, 2022 for U.S. Appl. No. 17/128,864, 9 pgs.

(Continued)

*Primary Examiner* — Henry Choe
(74) *Attorney, Agent, or Firm* — JAQUEZ LAND GREENHAUS & MCFARLAND LLP; John Land, Esq.

(57) ABSTRACT

A receiver front end capable of receiving and processing intraband non-contiguous carrier aggregate (CA) signals using multiple low noise amplifiers (LNAs). Cascode circuits, each having a "common source" configured input FET and a "common gate" configured output FET, serve as the LNAs. An amplifier-branch control switch, configured to withstand relatively high voltage differentials by means of a relatively thick gate oxide layer and coupled between a terminal of the output FET and a power supply, controls the ON and OFF state of each LNA while enabling use of a relatively thin gate oxide layer for the output FETs, thus improving LNA performance. Some embodiments may include a split cascode amplifier and/or a power amplifier.

20 Claims, 7 Drawing Sheets

(56) References Cited

U.S. PATENT DOCUMENTS

| | | |
|---|---|---|
| 9,941,849 B1 | 4/2018 | Ayranci |
| 11,043,922 B2 | 6/2021 | Watanabe |
| 11,588,447 B2 | 2/2023 | Golat et al. |
| 2018/0083577 A1 | 3/2018 | Wagh |
| 2022/0200546 A1 | 6/2022 | Golat et al. |

OTHER PUBLICATIONS

Choe, Henry, Notice of Allowance received from the USPTO dated Oct. 27, 2022 for U.S. Appl. No. 17/128,864, 6 pgs.

* cited by examiner

SOURCE SWITCH SPLIT LNA DESIGN WITH THIN CASCODES AND HIGH SUPPLY VOLTAGE

CROSS REFERENCE TO RELATED APPLICATIONS—CLAIM OF PRIORITY

This application is a continuation of commonly owned and U.S. patent application Ser. No. 17/128,864, filed Dec. 21, 2020, entitled "Source Switch Split LNA Design with Thin Cascodes and High Supply Voltage" to issue as U.S. Pat. No. 11,588,447 on Feb. 21, 2023, the disclosure of which is incorporated herein by reference in its entirety

BACKGROUND

(1) Technical Field

Various embodiments described herein relate to amplifiers and more particularly to low noise amplifiers for use in communications equipment.

(2) Background

The front end of a communications receiver typically includes a low noise amplifier ("LNA") that is responsible for providing the first stage amplification to a signal received by the receiver. The operational specifications of the LNA are very important to the overall quality of the receiver. Any noise or distortion in the input to the LNA will get amplified and cause degradation of the overall receiver performance. Accordingly, the sensitivity of a receiver is, in large part, determined by the quality of the front end and of the LNA in particular.

In some cases, the LNA is required to operate over a relatively broad frequency band and to amplify signals having several modulated baseband or intermediate frequency (IF) signals. One example of such a situation is reception of an intraband noncontiguous carrier aggregation (CA) signal. A CA signal can have two channels (or carrier components) having frequencies that are not adjacent to one another, but which lie in the same frequency band. For example, a CA signal may have two non-adjacent channels within a cellular frequency band defined by the 3rd Generation Partnership Project (3GPP), a well-known industry standard setting organization. In the case in which a receiver is required to receive a CA signal, such as a cellular telephone that is compliant with the 3GPP communications industry standard, the LNA typically amplifies the received signal and provides the amplified output signal to a passive splitter.

Figure 1:
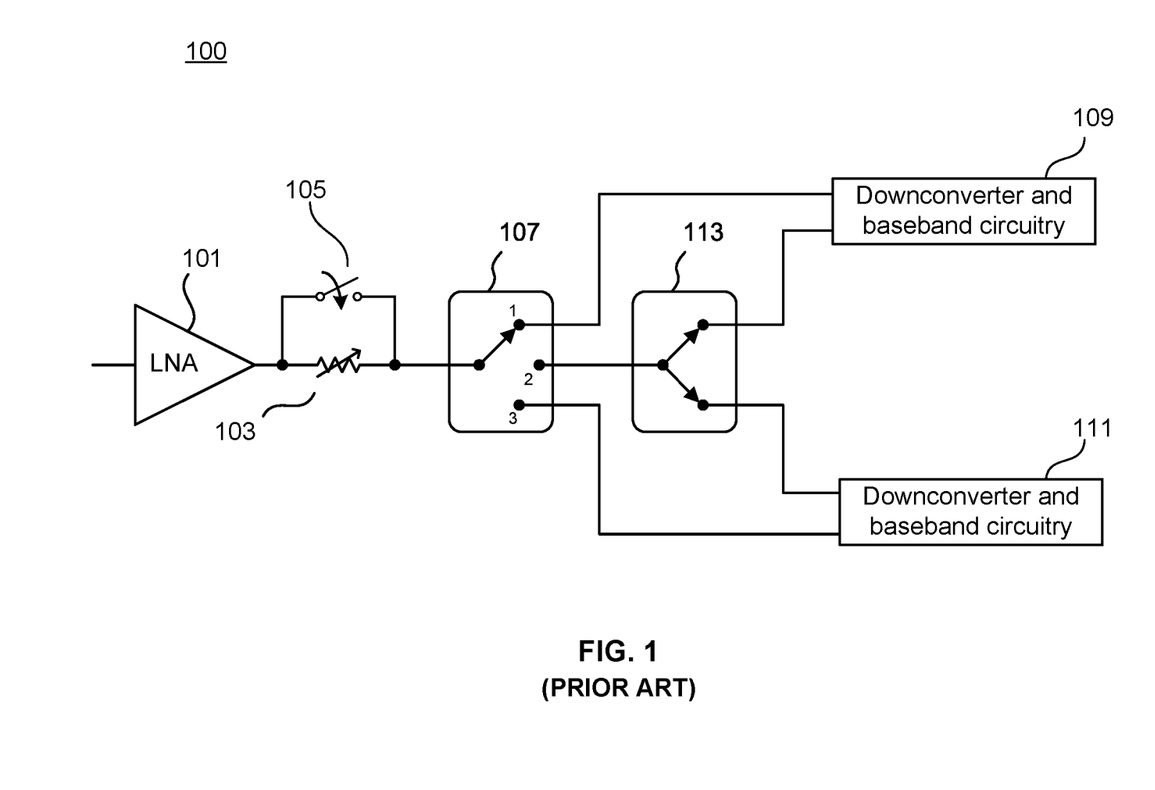
FIG. 1 is a simplified block diagram ion of a portion of a prior art cellular telephone receiver front end in which an LNA is coupled to a variable attenuator.

FIG. 1 is a simplified block diagram of a portion of a prior art cellular telephone receiver front end 100 in which an LNA 101 is coupled to a variable attenuator 103. A switch 105 coupled in parallel with the variable attenuator 103 allows the variable attenuator 103 to be optionally bypassed. The signal is then coupled to a mode selector switch 107 that allows the output of the LNA 101 to be selectively coupled to: (1) only a first downconverter and baseband circuitry (DBC) 109; (2) both the first DBC 109 and a second DBC 111; or (3) only the second DBC 111.

When the mode selector switch 107 is in the first position (i.e., "single mode 1"), the output of the LNA 101 is coupled only to the first DBC 109. In the second position (i.e., "split mode"), the output of the LNA 101 is coupled through a passive power splitter 113 to both the first and second DBC 109, 111. In the third position (i.e., "single mode 2"), the output of the LNA 101 is coupled only to the second DBC 111.

Figure 2:
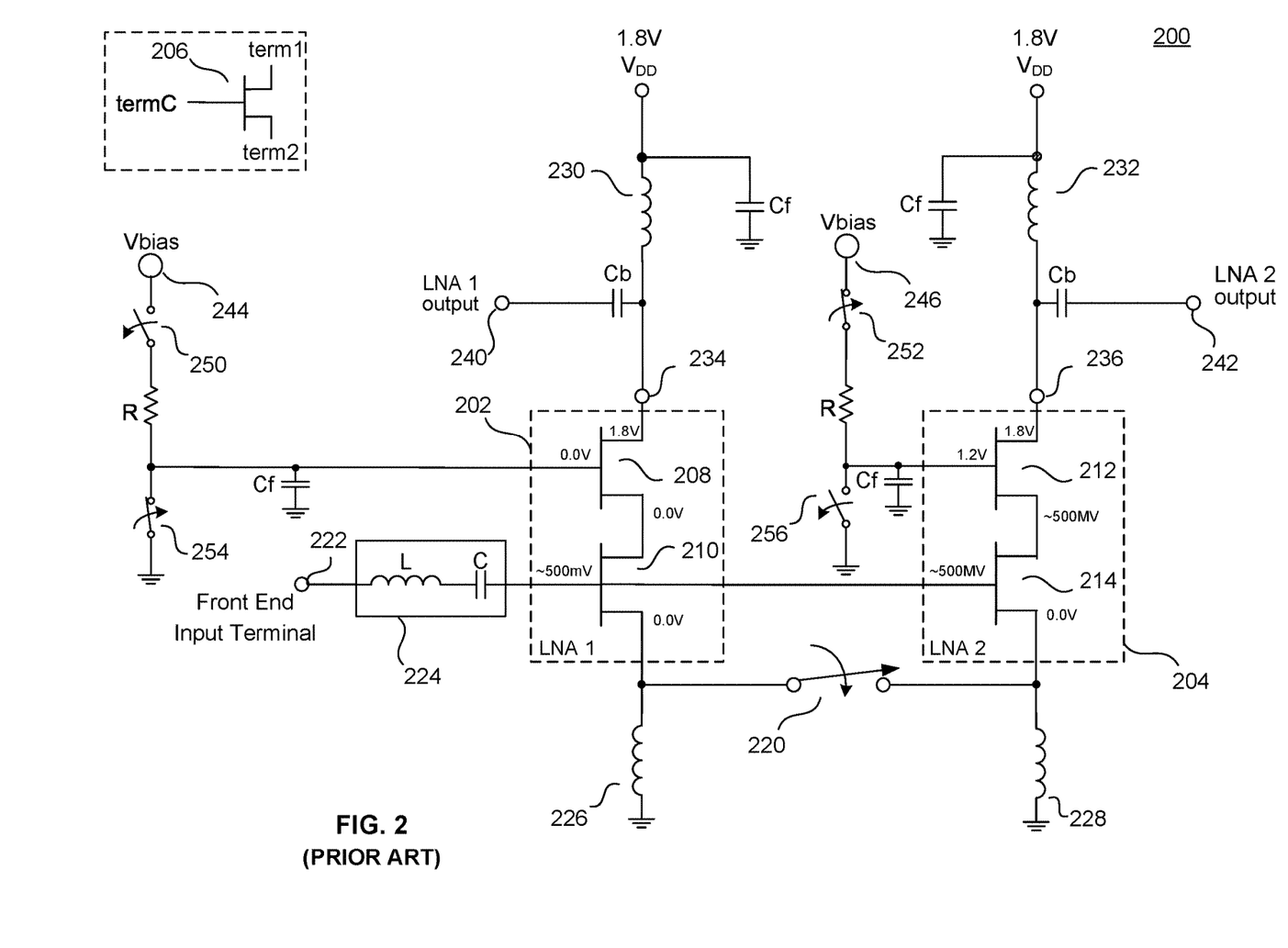
FIG. 2 is a simplified schematic showing an alternative prior art structure for coupling the input of a receiver front end to a desired output.

FIG. 2 is a simplified schematic showing an alternative prior art structure for coupling the input of a receiver front end to a desired output. A receiver front end 200 is shown that can receive and process CA signals using multiple LNAs. In this example, two LNAs 202, 204 are illustrated, each LNA 202, 204 comprising a pair of transistors configured as a cascode circuit operating as a two-stage amplifier.

While the examples in the figures of this disclosure show the transistors as field effect transistors (FETs), the devices are typically referred to generically throughout this disclosure as transistors and the connection nodes of the transistors are referred to as terminal 1 (i.e., "term1"), terminal 2 (i.e., "term2"), and a control terminal (i.e., "termC"). In embodiments in which the transistor is a FET, term1 is the connection to the FET drain, term2 is the connection to the FET source, and termC is the connection to the FET gate. In some cases, the drain and source of the FET are interchangeable. A schematic FET 206 shown in a dashed-box in the upper left corner of in FIG. 2 serves as a legend to the references used for each of the three terminals of the transistors discussed when the transistor is a FET. In embodiments in which the transistor is a bipolar junction transistor (BJT) or the like, term1 is the connection to the BJT collector, term2 is the connection to the BJT emitter, and termC is the connection to the BJT base.

In the case in which the transistors are FETs, each cascode circuit respectively comprises two FETs 208, 210, and 212, 214. The first FET 210, 214 of each pair is configured in a "common source" configuration and serves as an input for a respective LNA 202, 204. The second FET 208, 212 of each pair is configured in a "common gate" configuration and serves as an output FET for a respective LNA 202, 204. Each LNA 202, 204 may have additional transistors (e.g., more than two stages and/or stacked transistors, for example, to handle higher voltages). The control terminal of the input transistors 210, 214 are coupled together to form a common input to both LNAs 202, 204. However, in some cases the control terminal of the two input transistors 210, 214 can be separated to allow the ON and OFF states of the input transistor of an LNA 202, 204 to be independently controlled. Each LNA 202, 204 may be turned ON or OFF by applying an appropriate signal to the control terminal of the output transistor 208, 212 (e.g., the gate or base, depending upon the type of transistor).

A source switch 220 allows a connection to be either established or broken between term2 of the input transistor 210 and term2 of the other input transistor 214 within the two LNAs 202, 204. The source switch 220 may be controlled in coordination with turning the LNAs 202, 204 ON and OFF.

RF input signals to be amplified are coupled to the receiver front end 200 through a front-end input terminal 222. The front-end input terminal 222 may be coupled through an input matching (IM) circuit 224. In the illustrated example, the IM circuit 224 is shown as comprising a series-coupled input inductor L and input capacitor C, but other input matching circuitry may be used. The input matching circuit 224 is coupled to the control terminal of the input transistor 210, 214 of each LNA 202, 204. Each LNA 202, 204 may be coupled to circuit ground through a respective degeneration inductor 226, 228, and to a power source (e.g., $V_{DD}$) through a respective load inductor 230, 232 and power supply terminal 234, 236. Each LNA 202, 204 outputs an amplified signal at respective output terminals 240, 242. Various AC filter capacitors Cf and DC blocking capacitors Cb in a variety of suitable values may be coupled as shown if needed for a particular embodiment.

A bias voltage $V_{BIAS}$ may be selectively applied to the control terminal of the respective output transistor 208, 212 of each LNA 202, 204 through a respective bias terminal 244, 246 and associated bias switch 250, 252 and resistor R. When $V_{BIAS}$ is applied to a control terminal of an output transistor 208, 212, the output transistor 208, 212 is effectively enabled and the respective LNA 202, 204 is set to an ON state. Alternatively, the control terminal of an output transistor 208, 212 may be coupled to circuit ground through a respective shunt switch 254, 256. When a control terminal of an output transistor 208, 212 is grounded, the output transistor 208, 212 is effectively disabled and the respective LNA 202, 204 is set to an OFF state.

The configuration of the receiver front end 200 allows operation similar to the receiver front end 100 shown in FIG. 1. That is, in single mode, an input signal is amplified and present at only one of the output terminals 240, 242. However, rather having one LNA that is always active and selectively directing the output of the LNA to a particular output, the receiver front end 200 has two LNAs 202, 204, only one of which is turned ON in single mode. When the receiver front end 200 is operating in split mode, both LNAs 202, 204 are turned ON and accordingly the amplified input signal is presented at both output terminals 240, 242.

One issue that arises with the use of such a design is the magnitude of the voltage that occurs across the terminals of an output transistor 208, 212 when the respective LNA 202, 204 is turned OFF. More specifically, in the illustrated example, when an output transistor 208, 212 is turned OFF, the associated bias switch 250, 252 is opened, breaking the connection to the termC bias voltage $V_{BIAS}$. The associated shunt switch 254, 256 is closed, placing termC of the output transistor 208, 212 at ground potential. Accordingly, for an OFF output transistor 208, 212, the voltage between term1 and termC, Vic (e.g., the drain to gate voltage $V_{DG}$ when the output transistors 208, 212 are FETs), as well as between term1 and term2, $V_{12}$ (e.g., the drain to source voltage $V_{DS}$ when the transistors 208, 212 are FETs) can be relatively large, risking time-dependent dielectric breakdown (TDDB) of the OFF output transistor. Such conditions can adversely impact the operation of the receiver front end, and in some cases, cause the receiver front end to completely fail.

For example, in one case in which the $V_{DD}$ is 1.8 V and the bias voltage applied to the termC of the output transistors 208, 212 is 1.2 V, when the first LNA 202 is OFF (because bias switch 250 is open and shunt switch 254 is closed, as shown in FIG. 2), termC of the output transistor 208 is pulled to ground through the shunt switch 254. The voltage at $V_{DD}$ is then applied to term1 of the output transistor 208 through the associated load inductor 230 and power supply terminal 234, placing the voltage at term1 at 1.8 V. Both the termC voltage and the voltage at term2 will be 0 V, due to the path through the shunt switch 254 to ground. Accordingly, the voltage Vu (the voltage between term1 and term2) and the voltage Vic (the voltage between term1 and termC) will be 1.8 V. Such relatively large voltages across the junctions of a transistor, particularly a MOSFET, can potentially result in TDDB. One way to prevent this outcome is to ensure that the gate oxide layer of a MOSFET is sufficiently thick to withstand the expected OFF-state voltage. However, the thicker the gate oxide layer, the higher the noise figure of the amplifier and the lower the third order intercept point (IP3). Since these are typically considered unfavorable consequences, being able to fabricate the transistors of the LNA with thinner gate oxide layers is desirable.

Therefore, it would be desirable to provide a method and apparatus by which the voltages across an OFF-state output transistor of an LNA within a receiver front end can be tolerated using thinner gate oxide layers and thus have less negative impact on the third order intercept and noise figure for the LNA. The present invention meets this need and provides additional benefits.

SUMMARY OF THE INVENTION

A receiver front end is disclosed herein that comprises a plurality of low noise amplifier (LNA) branches, each having an LNA. In some embodiments, the LNAs of different branches are tuned to amplify signals in different frequency ranges. In some embodiments in which there are two such LNA branches, a source switch is coupled between the LNA branches to connect a source switch terminal of the first LNA branch to a source switch terminal of the second LNA branch. In some such embodiments, the receiver front end is configured to allow operation in at least three modes, "single mode 1", "single mode 2", and "split mode".

In single mode 1, a first of two LNAs is turned ON to allow input signals in the frequency range to which the first LNA is appropriate and which have been coupled to the receiver front end to be amplified by the first LNA. The second LNA is turned OFF in single mode 1. The source switch is closed during single mode 1. Accordingly, signals that are received by the receiver front end having a frequency within the range appropriate to be amplified by the LNA in the first LNA branch can be amplified with minimal distortion.

In single mode 2, the first LNA branch is turned OFF and the second LNA branch is turned ON. Similar to single mode 1, the source switch is closed in single mode 2. Accordingly, signals that are received by the receiver front end having a frequency within the range appropriate to be amplified by the LNA in the second LNA branch can be amplified with minimal distortion.

In split mode, both LNA branches are turned ON to allow a carrier aggregated signal having a first carrier in a frequency range that is appropriate for amplification by the first LNA and a second carrier that has a frequency that is appropriate for amplification by the second LNA. In addition, the source switch is opened to assist in maintaining the appropriate input impedance for the input signal.

In some embodiments, a pair of field effect transistors (FETs) are configured as a cascode pair for the LNAs within each of the LNA branches. In addition, FETs are used as amplifier-branch control switches to selectively apply a voltage to a power supply terminal of the LNA branches to turn one or both of the LNAs in the LNA branches ON and OFF. The output FETs in the LNA have a gate oxide layer that is relatively thin compared to the gate oxide layer of the amplifier-branch control switches, since the voltage applied to the output transistors will be relatively low compared to the voltage that is applied across the amplifier-branch control switches. Providing amplifier-branch control switches with relatively thick gate oxide layers allows FETs with relatively thin gate oxide layers to be used in the cascode pair in each LNA, which results in improved operation of the LNA.

More particularly, by controlling the ON and OFF states of an LNA branch by switching the power supply connection with a high-voltage tolerant switch (e.g., a FET with a thick gate oxide layer) instead of pulling the control terminal of a high-voltage tolerant output transistor up to a bias voltage or down to circuit ground, the output transistors may be configured (e.g., using FETs with a thin gate oxide layer) to improve the noise figure and the third order intercept of the LNA. Embodiments of the invention thus provide a significant advantage over prior art LNA circuits.

The concepts of the present invention may be applied to other LNA circuit architectures, such as a split cascode amplifier and/or a power amplifier.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION OF THE INVENTION

General Embodiment

Figure 3:
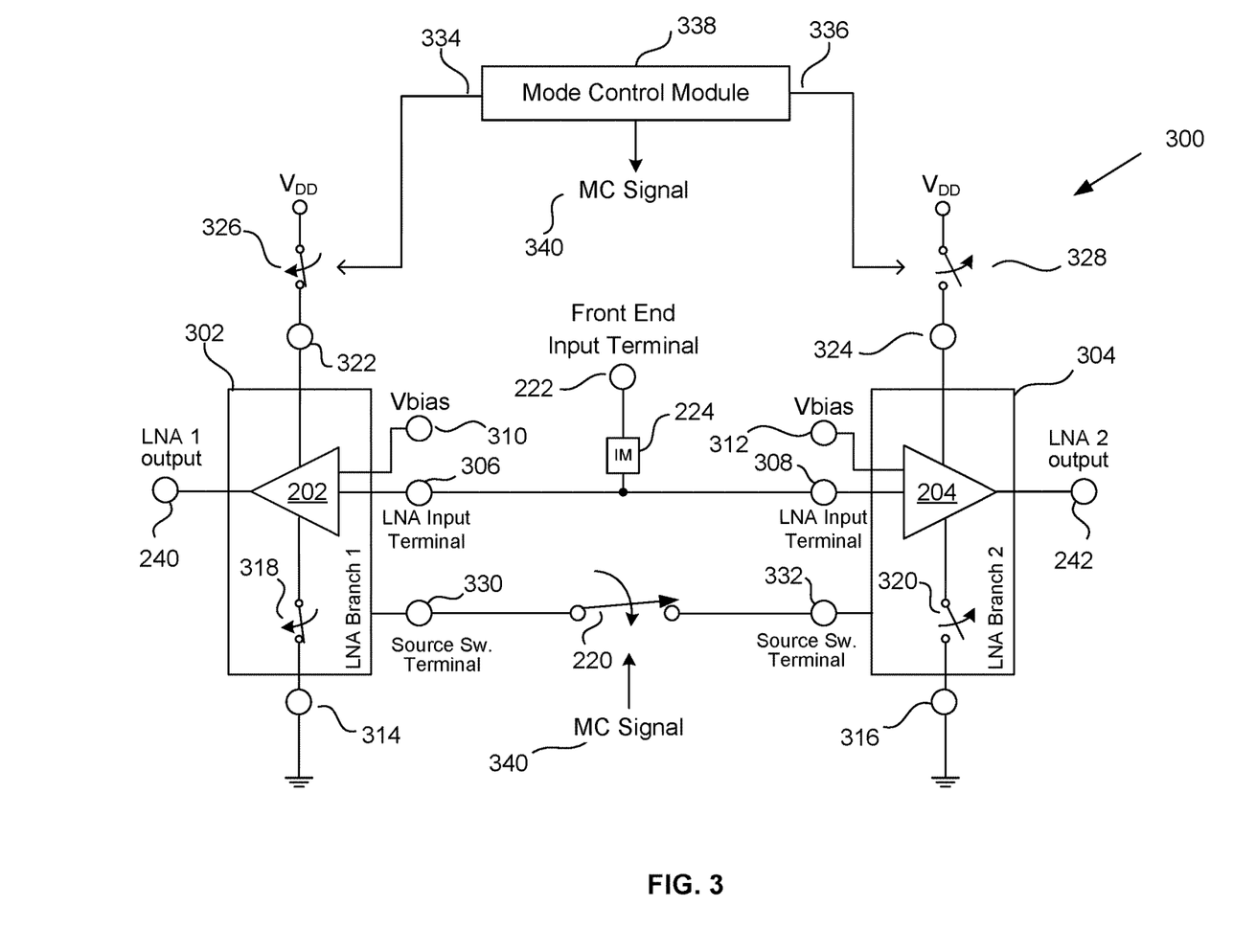
FIG. 3 is an illustration of a receiver front end in which multiple low noise amplifiers (LNAs) within different LNA branches are used to amplify radio frequency (RF) input signals.

FIG. 3 is an illustration of a receiver front end 300 in which multiple low noise amplifiers (LNAs) 202, 204 within different LNA branches 302, 304 are used to amplify radio frequency (RF) input signals. In the embodiment shown in FIG. 3, two branches are shown. However, it will be understood that additional similar branches may also be provided within the receiver front end 300. RF input signals to be amplified are coupled to the receiver front end 300 through a front-end input terminal 222. The front-end input terminal 222 may be coupled through an input matching (IM) circuit 224 (see, for example, FIG. 2). The IM circuit 224 is coupled to respective input terminals 306, 308 of the LNA branches 302, 304. A bias voltage may be applied to each LNA 202, 204 of each LNA branch 302, 304 through a respective bias terminal 310, 312; notably, in the illustrated example, the bias terminals 310, 312 are not configured to be shunted to circuit ground. Each LNA branch 302, 304 includes a degeneration terminal 314, 316 that couples the associated LNA 202, 204 to ground through an associated degeneration switch 318, 320, and an associated power supply terminal 322, 324 selectively couplable to a power source (e.g., $V_{DD}$) through corresponding amplifier-branch control switches 326, 328. An output terminal 240, 242 associated with a respective LNA branch 302, 304 provides an amplified version of an RF input signal. A source switch 220 may be coupled to source switch terminals 330, 332 corresponding to each LNA branch 302, 304.

Control signals 334, 336 are applied to corresponding amplifier-branch control switches 326, 328 to control whether each LNA 202, 204 is ON or OFF (i.e., amplifying or not amplifying). By closing or opening the amplifier-branch control switches 326, 328, the power supply $V_{DD}$ to a respective LNA branch 302, 304 is selectively connected or disconnected from the associated power supply terminal 322, 324 coupled to term1 of the corresponding output transistor 208, 212 (see FIG. 2 and FIGS. 4A & 4B). Thus, an important difference of the example receiver front end 300 is that that ON or OFF state of an LNA 202, 204 is controlled by switching the power supply of the corresponding LNA branch 302, 304 rather than by switching the bias voltage to the control terminals of the output transistors 208, 212 for such LNAs 202, 204.

In some embodiments, the control signals 334, 336 are generated by a mode control module 338. The state of each control signal is determined based on the mode in which the receiver front end 300 is operating. In some embodiments, the mode of operation is determined by the mode control module 338 based on information regarding the types of signals that will be received by the receiver front end 300 (e.g., whether CA or non-CA signals), the content carried by the signals, and/or based on user commands to select one or more channels.

The mode control module 338 may be a general-purpose processor capable of receiving commands and processing the commands to generate the control signals 334, 336 to the amplifier-branch control switches 326, 328. Alternatively, the mode control module 338 may be a dedicated processor specially designed for generating the control signals 334, 336. Those skilled in the art will understand how to make such a processor for receiving a command to enter a particular mode, determine the particular state of each of the switches for that mode and provide the appropriate control signals 334, 336 to place the switches in the desired mode. In some cases, the mode control module 338 may be as simple as a logic block with a look-up table. Alternatively, in some embodiments, the mode control module 338 may also rely upon additional information in determining the states of the control signals 334, 336.

As one example of operation of the receiver front end 300, in a first mode ("single mode 1"), LNA 202 is ON (i.e., is enabled, thus actively amplifying a signal applied to the input of the LNA 202). The amplified output of the active LNA 202 is coupled to output terminal 240. In the first mode, the other LNA 204 is OFF (i.e., is disabled, thus not actively amplifying the signal applied to the input of the LNA 204). Accordingly, the amplified input signal appears at output terminal 240 of LNA branch 302 and does not appear at output terminal 242 of LNA branch 304. In FIG. 3, the receiver front end 300 is configured in single mode 1.

Figure 4A:
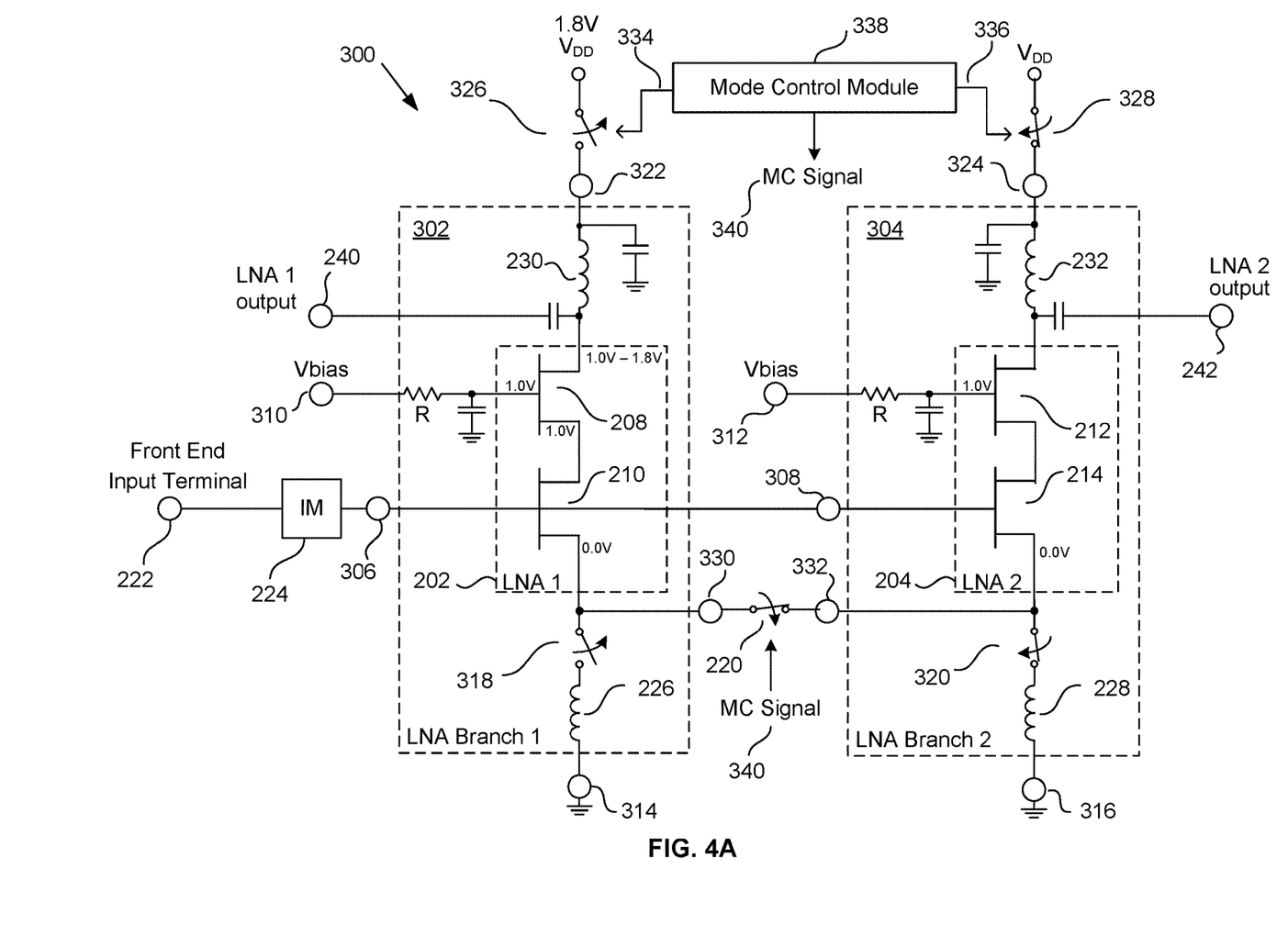
FIG. 4A shows additional details of each of the two LNA branches of FIG. 3.

In a second mode ("single mode 2"), LNA 202 is OFF and LNA 204 is ON, and accordingly the amplified input signal appears at output terminal 242 of LNA branch 304 and does not appear at output terminal 240 of LNA branch 302. In FIG. 4A described below, the receiver front end 300 is configured in single mode 2.

In split mode, both LNAs 202, 204 are ON (enabled) and accordingly the amplified input signal appears at both output terminal 240 of LNA branch 302 and output terminal 242 of LNA branch 304.

In some embodiments, the source switch 220 is open in split mode, and closed in single mode 1 or 2. By coordinating the state of the source switch 220 with the operation of the LNAs 202, 204, the input impedance of the receiver front end 300 in single mode 1 or 2 as seen at the front end input terminal 222 will more closely approximate the input impedance seen during split mode. In some embodiments, coordination of the source switch 220 with the operation of the LNAs 202, 204 is controlled by a mode control signal 340 generated by the mode control module 338.

Detailed Embodiment

FIG. 4A shows additional details of each of the two LNA branches 302, 304 of FIG. 3. As should be clear, the interior details for the two LNA branches 302, 304 are similar in many (but not all) respects to a conventional LNA (compare FIG. 2; note that labels for the AC filter capacitors and DC blocking capacitors are omitted for clarity). The amplifier-branch control switches 326, 328 and source switch 220 are shown in FIG. 4A to be configured for operation of the receiver front end 300 in single mode 2 (i.e., LNA branch 304 is ON and LNA branch 302 is OFF). Accordingly, the control signal 334 causes amplifier-branch control switch 326 to be open and the control signal 336 causes amplifier-branch control switch 328 to be closed. In the illustrated example, the mode control signal 340 to the source switch 220 causes the source switch 220 to be closed in both single mode 1 (as shown in FIG. 3) and single mode 2 (as shown in FIG. 4A). The transistors in FIG. 4A may by FETs or BJTs.

It can be seen that the source switch 220 allows the term2 of each input transistor 210, 214 to be selectively connected or disconnected. During single mode 1 or 2, the term2 of each input transistor 210, 214 is connected; during split mode, the term2's are disconnected. By connecting the term2 of each input transistor 210, 214, the termC/term2 junction of each transistor is placed in parallel. Together with the IM circuit 224, connecting the term2 of each input transistor 210, 214 in single mode 1 or 2 assists in keeping the input impedance seen at the front end input terminal 222 essentially the same as when the receiver front end 300 is in the split mode and the term2's are disconnected.

As noted above, a degeneration switch 318 is coupled to the term2 of the input transistor 210 of LNA 202 and a degeneration switch 320 is coupled to the term2 of the input transistor 214 of LNA 204. Each of the degeneration switches 318, 320 may be controlled by the mode control module 338 (for the sake of simplicity, the control lines from the mode control module 338 to the degeneration switches are not shown in FIG. 4A). In general, each of the degeneration switches 318, 320 are set to the same state as the corresponding amplifier-branch control switches 326, 328, but need not be. For example, when the mode control module 338 places the front end in single mode 1 (i.e., only LNA 202 is ON or enabled), the source switch 220 is closed, amplifier-branch control switch 326 and degeneration switch 318 are closed, and amplifier-branch control switch 328 and degeneration switch 320 are opened (thus, LNA 204 is OFF or disabled). Similarly, when the mode control module 338 places the front end in single mode 2 (i.e., only LNA 204 is ON or enabled), the source switch 220 is closed, amplifier-branch control switch 328 and degeneration switch 320 are closed, and amplifier-branch control switch 326 and degeneration switch 318 are opened (thus, LNA 202 is OFF or disabled). In contrast, in split mode, both degeneration switches 318, 320 are closed and both amplifier-branch control switches 326, 328 are closed (thus allowing both LNAs 202, 204 to be ON or enabled), and the source switch 220 is opened to adjust the impedance seen at the front end input terminal 222. TABLE 1 sets forth the various switch states as a function of mode for the example receiver front end 300 of FIG. 4A:

TABLE 1

| Switch | Single Mode 1 | Single Mode 2 | Split Mode |
|---|---|---|---|
| amplifier-branch control switch 326 | Closed | Open | Closed |
| amplifier-branch control switch 328 | Open | Closed | Closed |
| degeneration switch 318 | Closed | Open | Closed |
| degeneration switch 320 | Open | Closed | Closed |
| source switch 220 | Closed | Closed | Open |

Notably, the voltage applied to the control terminals of the output transistors 208, 212 (i.e., $V_{BIAS}$ or ground) need not be switchable, as in conventional designs (compare FIG. 2), and does not control the ON or OFF state of the corresponding LNA 202, 204. Constantly coupling the control terminals of the output transistors 208, 212 to an enabling $V_{BIAS}$ (e.g., a positive $V_{BIAS}$) in both ON and OFF states (rather than grounding those terminals in an OFF state) helps in controlling the operational voltages within the receiver front end 300, particularly across the output transistors 208, 212 when in an OFF state. Note that $V_{BIAS}$ need not be the same for both of the output transistors 208, 212—that is, each of the output transistors 208, 212 may have a unique $V_{BIAS}$ value applied.

Operational Voltages

Looking now at the operational voltages of the receiver front end 300 during single mode 2 in more detail, LNA branch 304 is in an ON state and LNA branch 302 is in an OFF state. Accordingly, amplifier-branch control switch 326 is open, causing term1 of output transistor 208 to essentially float. With amplifier-branch control switch 326 open, the voltage at term1 of output transistor 208 will be determined by the relative amount of current leakage through amplifier-branch control switch 326 with respect to the amount of current leakage between term1 and term2 of output transistor 208. The greater the leakage though amplifier-branch control switch 326 with respect to the leakage from term1 to term2, the closer the voltage at term1 will be to $V_{DD}$. Accordingly, the voltage at term1 will be between the voltage $V_{DD}$ (as applied to open amplifier-branch control switch 326) and the voltage at term2 of output transistor 208. The voltage at term2 of output transistor 208 will be approximately equal to the termC bias voltage.

Thus, for a bias voltage of approximately 1.0 V applied to termC, the voltage at term2 of output transistor 208 will be approximately equal to 1.0 V. If $V_{DD}$ is approximately 1.8 V, the voltage at term1 of output transistor 208 will be between 1.0 V and 1.8 V. That results in a voltage $V_{c2}$ (i.e., between termC and term2) of 0.0 V and a voltage $V_{12}$ (i.e., between term1 and term2) in the range of 0.0 V to 0.8 V depending upon the voltage at term1, which in turn depends upon the amount of leakage through amplifier-branch control switch 326 and the leakage between term1 and term2 of output transistor 208. Thus, the difference between the bias voltage $V_{BIAS}$ and the voltage of the power source is less than or equal to about 1 V.

Accordingly, for the embodiment in which the transistors 208, 210, 212, 214 of the LNAs 202, 204 are FETS, the OFF-state drain to source voltage $V_{DS}$ will be between 0.0 V and 0.8 V, depending on the relative leakage of the components. This contrasts with the receiver front end 200 shown in FIG. 2 in which $V_{DS}$ is the full 1.8 V across output transistor 208 of FIG. 2 in the OFF state (i.e., when the gate of output transistor 208 is pulled to ground by opening bias switch 250 and closing shunt switch 254). As a result, FET-based output transistors 208, 212 of embodiments of the present invention need not be designed to withstand the higher OFF-state $V_{DS}$ which FET-based output transistors 208, 212 of conventional designs must withstand. In particular, conventional FET-based designs like the receiver front end 200 of FIG. 2 generally use FETs having thick gate oxide layers for the output transistors 208, 212 in order to withstand the relatively high OFF-state voltage, which results in a higher noise figure and a lower third order intercept point (IP3) compared with using FETs having thin gate oxide layers for the output transistors 208, 212, as in embodiments of the present invention (note that the input FETs may also have a thin gate oxide layer, which may have essentially the same thickness as the gate oxide layer of the output FETs). Instead, the amplifier-branch control switches 326, 328 may be implemented as FETs having thick gate oxide layers sufficient to withstand OFF-state voltages. By placing the amplifier-branch control switches 326, 328 between respective load inductors 230, 232 and the power source (e.g., $V_{DD}$), the control of ON and OFF states has little or no effect on the noise figure and the third order intercept of the LNA.

More generally, in embodiments of the present invention, changing the dimensions of the output transistors 208, 212, such as by making the gate oxide layer of a MOSFET thinner with respect to the FETs of conventional configurations in which the bias terminal is switched to ground, and also relatively thin with respect to the gate oxide layer of the FETs used to implement the amplifier-branch control switches 326, 328, will have a beneficial impact on the noise figure and the third order intercept of the LNA.

In addition, in FET-based embodiments, the thinner oxide layer may beneficially alter the ideal bias voltage applied to the gate of each output transistor 208, 212. For example, in FIG. 2, the bias to termC in the receiver front end 200 is 1.2 V. In contrast, in FIG. 4A, the bias to termC of the receiver front end 300 is 1.0 V. That is, since the OFF-state voltages to be tolerated across the output transistors 208, 212 are lower than conventional designs, the gate oxide layer may be thinner in the FETs of the receiver front end 300, and accordingly the ideal bias voltage may shift slightly down with respect to the bias voltage used in the receiver front end 200.

Thus, by controlling the ON and OFF states of an LNA branch 302, 304 by switching the power supply connection with a high-voltage tolerant switch (e.g., a FET with a thick gate oxide layer) instead of pulling the control terminal of a high-voltage tolerant output transistor up to $V_{BIAS}$ or down to circuit ground, the output transistors may be configured (e.g., using FETs with a thin gate oxide layer) to improve the noise figure and the third order intercept of the LNA. Embodiments of the invention thus provide a significant advantage over prior art LNA circuits.

Split Cascode Embodiment

Figure 4B:
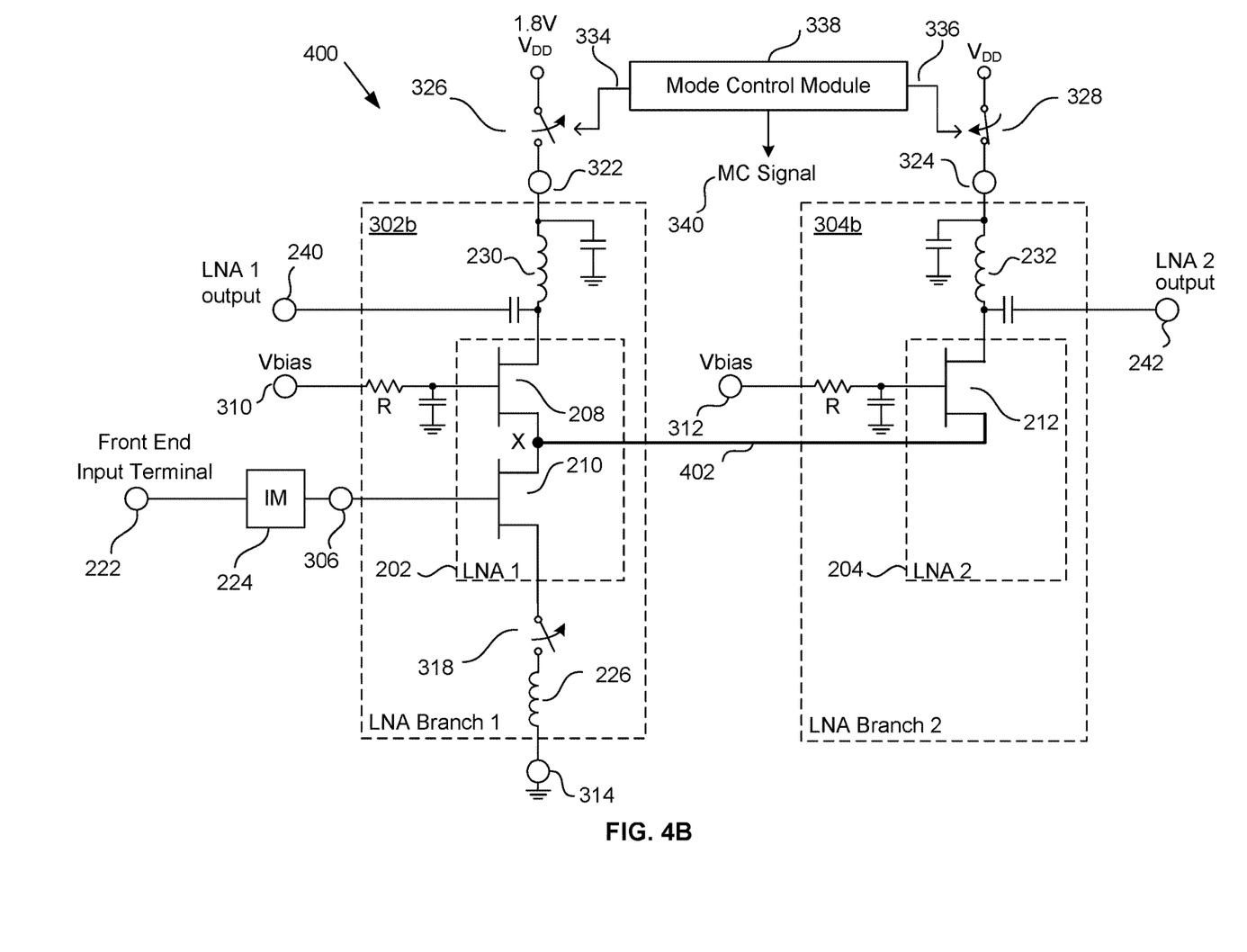
FIG. 4B is an alternative embodiment of the embodiment of FIG. 4A, showing a receiver front end having a split cascode configuration.

The concepts of the present invention may be applied to other LNA circuit architectures. For example, FIG. 4B is an alternative embodiment of the embodiment of FIG. 4A, showing a receiver front end 400 having a split cascode configuration. In the illustrated example, LNA Branch 2 (reference number 304b) includes an output transistor 212 having term2 coupled by a signal line 402 directly to a node X between the FETs 208, 210 of LNA Branch 1 (reference number 302b). Omitted from the configuration of FIG. 4A are the source switch 220, the input transistor 214, the degeneration inductor 228, and the degeneration switch 320. Accordingly, a split cascode configuration has fewer components and thus allows for a smaller integrated circuit die size. As should be clear, more than one branch configured like LNA Branch 2 304b may be coupled to node X.

In operation, LNA branch 304b, when enabled, shares the input transistor 210, the degeneration inductor 226, and the degeneration switch 318 of LNA branch 302b. By applying particular values of $V_{BIAS}$ (which may differ for the two LNA branches) to the LNA branches 302b, 304b, the receiver front end 400 can operate in split mode (both LNA branches 302b, 304b provide amplified outputs on respective output terminals 240, 242), or in single mode 1 (only LNA branch 302b provides an amplified output on its output terminal 240), or in single mode 2 (only LNA branch 304b provides an amplified output on its output terminal 242). In split mode 1 or in single mode 2, an RF input signal applied to the front-end input terminal 222 results in a signal at node X that is coupled to both of the amplifying output transistors 208, 212.

Methods

Figure 5:
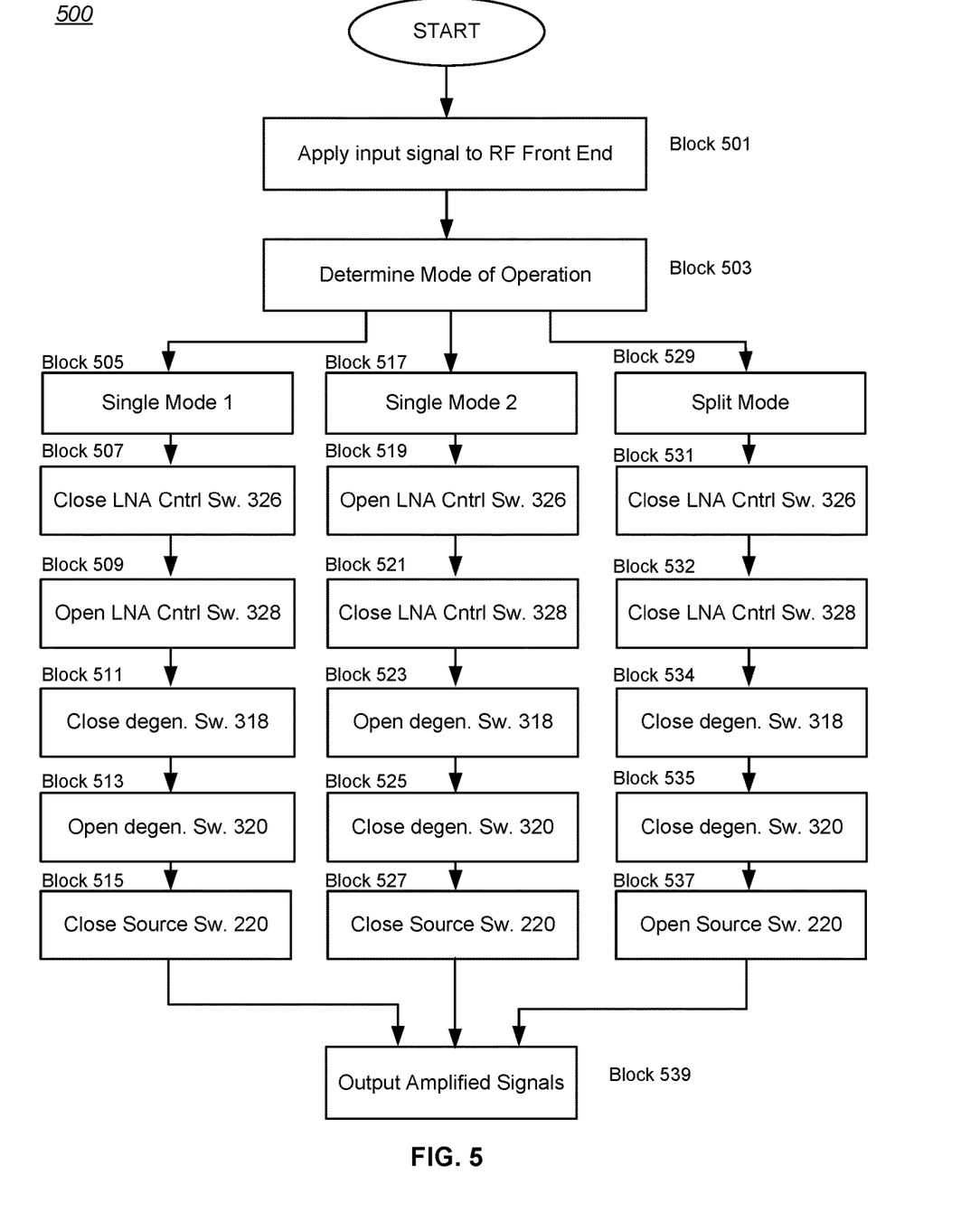
FIG. 5 is an illustration of a method in accordance with one embodiment for selectively amplifying a signal that may be either a non-CA signal or a CA signal using more than one amplifier having a high power supply voltage.

FIG. 5 is an illustration 500 of a method in accordance with one embodiment for selectively amplifying an RF signal that may be either a non-CA signal or a CA signal using more than one amplifier having a relatively high power supply voltage. The RF signal is applied to the input of the amplifiers (BLOCK 501). In some embodiments, the RF signal includes a first and a second non-adjacent channel. The first and second channels are considered to be non-adjacent if there is at least a narrow frequency range between the defined end of the frequency range of the first channel and the defined beginning of the frequency range of the second channel. Typically, at least a third channel is defined within the frequency range between the end of the first and beginning of the second channel. The frequency range of a channel is typically defined by industry standards, but in some cases may be defined by the 3 dB frequency range of filters commonly used to receive signals transmitted over the channel.

The method further includes selecting between a single mode 1, single mode 2, or a split mode (BLOCK 503). In one embodiment, the selection between single mode 1, single mode 2, and split mode is made based on whether the RF signal applied to the receiver front end input is within a frequency appropriate to be amplified by the first LNA branch 302 or the second LNA branch 304, or alternatively, if the RF signal is a CA signal having carriers appropriate to both the LNA branches 302, 304. In some embodiments, the determination is made in the mode control module 338 based on information received by the mode control module 338 or detected in the received RF signals.

Upon a determination that the receiver front end is to operate in single mode 1 (BLOCK 505), amplifier-branch control switch 326 is closed (BLOCK 507) to connect the high voltage power supply $V_{DD}$ to term1 of output transistor 208 of LNA 202 within LNA branch 302. amplifier-branch control switch 328 is opened (BLOCK 509) to disconnect the high voltage power supply $V_{DD}$ from term1 of output transistor 212 of LNA 204 within LNA branch 304. In addition, degeneration switch 318 is closed (BLOCK 511), degeneration switch 320 is opened (BLOCK 513), and source switch 220 is closed (BLOCK 515). Thus, LNA 202 is turned ON and LNA 204 is turned OFF, and an amplified signal is output (BLOCK 539).

Alternatively, if a determination is made that the receiver front end is to operate in single mode 2 (BLOCK 517), amplifier-branch control switch 326 is opened (BLOCK 519) to disconnect the high voltage power supply $V_{DD}$ from term1 of output transistor 208 of LNA 202 within LNA branch 302. amplifier-branch control switch 328 is closed (BLOCK 521) to connect the high voltage power supply $V_{DD}$ to term1 of output transistor 212 of LNA 204 within LNA branch 304. In addition, degeneration switch 318 is opened (BLOCK 523), degeneration switch 320 is closed (BLOCK 525), and source switch 220 is closed (BLOCK 527). Thus, LNA 202 is turned OFF and LNA 204 is turned ON, and an amplified signal is output (BLOCK 539).

It should be noted that when the source switch 220 is closed, the two degeneration switches 318, 320 are in parallel with one another. Therefore, either degeneration switch 318, 320 may be closed and the other opened to maintain the same inductance coupled to each term2 of the input transistors 210, 214 in each of the two single modes. Accordingly, in one embodiment, the state of the two degeneration switches 318, 320 need not change when changing from single mode 1 to single mode 2 or vice versa. In some embodiments, there may be a benefit to being able to select which degeneration inductor 226, 228 the term2 current will flow through, depending upon which of the LNAs 202, 204 is active and which is inactive.

If a determination is made that the receiver front end is to operate in split mode (BLOCK 529), amplifier-branch control switch 326 is closed (BLOCK 531) to connect the high voltage power supply $V_{DD}$ to term1 of output transistor 208 of LNA 202 within LNA branch 302. amplifier-branch control switch 328 is closed (BLOCK 532) to connect the high voltage power supply $V_{DD}$ to term1 of output transistor 212 of LNA 204 within LNA branch 304. In addition, degeneration switch 318 is closed (BLOCK 534), degeneration switch 320 is closed (BLOCK 535), and source switch 220 is opened (BLOCK 537). Thus, both LNA 202 and LNA 204 are turned ON, and an amplified signal is output (BLOCK 539).

Upon having established the proper state for each of the switches 220, 318, 320, 326, 328, the RF input signal will be amplified by the "ON" LNAs 202, 204 and output through the respective output terminal 240, 242 of the receiver front end 300 (BLOCK 539). In some embodiments, each of the switches 220, 318, 320, 326, 328, are controlled by the mode control module 338.

Figure 6:
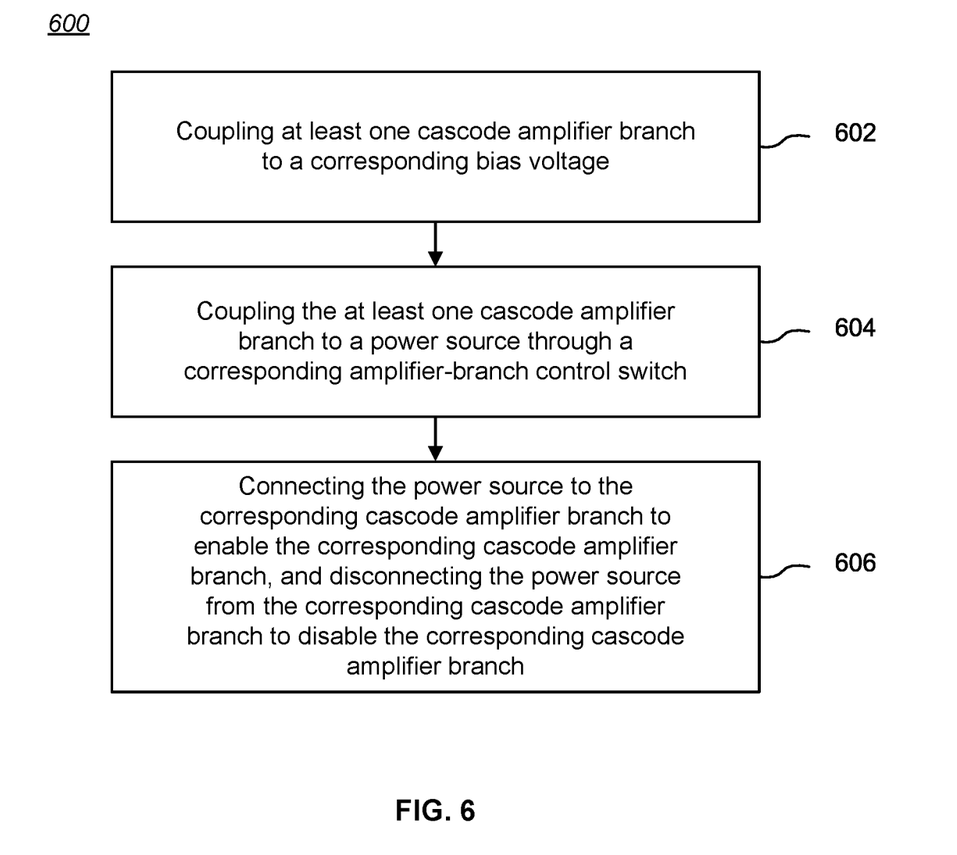
FIG. 6 is a process flow chart showing one method for operating an amplifier.

Another aspect of the invention includes methods for operating an amplifier. For example, FIG. 6 is a process flow chart 600 showing one method for operating an amplifier. The method includes: coupling at least one cascode amplifier branch to a corresponding bias voltage (BLOCK 602); coupling the at least one cascode amplifier branch to a power source through a corresponding amplifier-branch control switch (BLOCK 604); and connecting the power source to the corresponding cascode amplifier branch to enable the corresponding cascode amplifier branch, and disconnecting the power source from the corresponding cascode amplifier branch to disable the corresponding cascode amplifier branch (BLOCK 606).

Additional aspects of the above method may include one or more of the following: wherein the corresponding bias voltage remains coupled to the corresponding cascode amplifier branch regardless of the enabled or disable state of the corresponding cascode amplifier branch; wherein each cascode amplifier branch includes an input field effect transistor (FET) and an output FET configured as a cascode pair, and each amplifier-branch control switch is a FET, wherein each FET has a gate oxide layer, the gate oxide layer of each amplifier-branch control switch FET is thicker than the gate oxide layer of at least the output FET of the corresponding cascode amplifier branch; wherein the gate oxide layer of each amplifier-branch control switch FET is sufficiently thick to withstand a voltage from the power source during the second mode of operation; further including coupling a source switch between source switch terminals of two cascode amplifier branches and connecting the coupled source switch terminals if only one of the two cascode amplifier branches is enabled, and to disconnecting the coupled source switch terminals if both of the two cascode amplifier branches are enabled; and/or coupling an associated degeneration switch to the two cascode amplifier branches, if the two cascode amplifier branches are enabled or are to be enabled, then closing the associated degeneration switches, and if only one of the two cascode amplifier branches is enabled or is to be enabled, then closing the associated degeneration switch of the enabled cascode amplifier branch and opening the degeneration switch of the other casc ode amplifier branch.

Fabrication Technologies and Options

While the inventive embodiments of this disclosure have focused on low-noise amplifiers, the disclosed circuits and methods may be applied to other types of amplifiers, and in particular to power amplifiers.

It will be understood by those skilled in the art that N amplifier branches may be coupled in parallel to extend the number of channels (to N≥2) that the front end receiver 300 can select and allow selection all possible ON and OFF permutations of the N number of channels using additional modes of operation. Conversely, the disclosed circuits and methods may be applied to an amplifier having a single branch, since a high-voltage amplifier-branch control switch allows the output transistor of an amplifier branch to be implemented with relatively low-voltage transistors, with the attendant benefits of low noise figure and third order intercept point.

In one embodiment of the disclosed method and apparatus, each LNA 202, 204 comprises a pair of transistors 208, 210, 212, 214, configured as a cascode pair that acts as a two-stage amplifier. While some types of transistors may be better suited to particular applications, the concepts associated with the disclosed method and apparatus do not exclude the use of any particular type of transistor to be used in either the LNAs or the switches shown. Accordingly, as was noted above with regard to the transistors discussed with regard to FIG. 2, it should be clear that the illustration in the figures of FETs merely provides one example of the implementation of the disclosed receiver front end 300. Thus, in other embodiments, other suitable transistor types may be used, including, but are not limited to, metal-oxide-semiconductor FETs (MOSFETs), bipolar junction transistors (BJTs), junction field effect transistors (JFETs), insulated gate FETs (IGFETs), metal semiconductor FETs (MESFETs), etc. and may be implemented in transistor technologies such as bipolar, GaAs HBT, GaN HEMT, GaAs pHEMT, Indium Phosphide HEMT (InP HEMT) and MESFET technologies. It should be clear that this is not a complete list of all types of transistors and transistor technologies that may be used. In addition, integrated circuit embodiments of the receiver front end 300 may be fabricated using any suitable substrates and processes, including but not limited to standard bulk silicon, silicon-on-insulator (SOI), silicon-on-sapphire (SOS), GaN HEMT, GaAs pHEMT, and MESFET technologies. In some embodiments, the amplifier-branch control switches 326, 328 in particularly may be advantageously implemented as PMOS FETs.

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In some embodiments, certain components, such as large capacitors and/or inductors, may be external to other circuitry embodied in an IC. For example, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form an end product such as a cellular telephone, laptop computer, or electronic tablet, or to form a higher level module which may be used in a wide variety of products, such as vehicles, test equipment, medical devices, etc. Through various configurations of modules and assemblies, such ICs typically enable a mode of communication, often wireless communication.

A number of embodiments of the claimed invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the claimed invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. An amplifier, including:
    (a) a first cascode amplifier branch including:
        (1) an input field effect transistor (FET) coupled between a node and a degeneration terminal, and configured to receive an input signal on an input terminal;
        (2) a first output FET coupled between a first output terminal and the node, and including a first bias terminal;
        (3) a first load inductor coupled to the first output FET; and
        (4) a first power supply terminal coupled to the first load inductor;
    (b) a second cascode amplifier branch including:
        (1) a second output FET including a first terminal coupled to a second output terminal, a second terminal coupled through a signal path to the node, and a second bias terminal;
        (2) a second load inductor coupled to the first terminal of the second output FET; and
        (3) a second power supply terminal coupled to the second load inductor;
    (c) a first amplifier-branch control switch coupled to the first power supply terminal and configured to be coupled to a power source; and
    (d) a second amplifier-branch control switch coupled to the second power supply terminal and configured to be coupled to the power source.

2. The amplifier of claim 1, wherein the first and second cascode amplifier branches each have an amplifying ON mode of operation and a non-amplifying OFF mode of operation.

3. The amplifier of claim 2, wherein the first and second cascode amplifier branches may concurrently be in the amplifying ON mode of operation.

4. The amplifier of claim 1, wherein:
(a) in a first mode of operation, the first amplifier-branch control switch connects the power source to the first power supply terminal to enable the first amplifier branch, and the second amplifier-branch control switch disconnects the power source from the second power supply terminal to disable the second cascode amplifier branch;
(b) in a second mode of operation, the second amplifier-branch control switch connects the power source to the second power supply terminal to enable the second amplifier branch, and the first amplifier-branch control switch disconnects the power source from the first power supply terminal to disable the first cascode amplifier branch; and
(c) in a third mode of operation, the first amplifier-branch control switch connects the power source to the first power supply terminal to enable the first amplifier branch, and the second amplifier-branch control switch connects the power source to the second power supply terminal to enable the second amplifier branch.

5. The amplifier of claim 1, wherein each FET has a gate oxide layer and wherein the respective gate oxide layers of the input FET and the first and second output FETs have essentially the same thickness.

6. The amplifier of claim 1, wherein:
(a) the first amplifier-branch control switch and the second amplifier-branch control switch are FETs each including a gate oxide layer having a first thickness; and
(b) the first and second output FETs each include a thickness gate oxide layer having a second thickness that is thinner than the first thickness.

7. The amplifier of claim 1, wherein the first amplifier-branch control switch and the second amplifier-branch control switch are FETs capable of withstanding more voltage than the first and second output FETs.

8. The amplifier of claim 1, wherein:
(a) the first amplifier-branch control switch and the second amplifier-branch control switch are FETs capable of withstanding a first OFF-state drain-to-source voltage $V_{DS}$; and
(b) the first and second output FETs are capable of withstanding a second OFF state drain-to-source voltage $V_{DS}$ less than the first OFF-state drain-to-source voltage $V_{DS}$.

9. The amplifier of claim 1, wherein a first bias voltage applied to the first bias terminal and a second bias voltage applied to the second bias terminal remain applied regardless of an enabled or disabled state of the corresponding cascode amplifier branch.

10. The amplifier of claim 9, wherein a difference between the first and second bias voltages and a voltage of the power source is less than or equal to about 1 volt.

11. An amplifier, including:
(a) a first cascode amplifier branch including:
(1) a first input field effect transistor (FET) coupled between a first node and a first source switch terminal, and configured to receive an input signal on a first input terminal;
(2) a first output FET coupled between a first output terminal and the first node, and including a first bias terminal;
(3) a first load inductor coupled to the first output FET; and
(4) a first power supply terminal coupled to the first load inductor;
(b) a second cascode amplifier branch including:
(1) a second input FET coupled between a second node and a second source switch terminal, and configured to receive the input signal on a second input terminal;
(2) a second output FET coupled between a second output terminal and the second node, and including a second bias terminal;
(3) a second load inductor coupled to the second output FET; and
(4) a second power supply terminal coupled to the second load inductor;
(c) a first amplifier-branch control switch coupled to the first power supply terminal and configured to be coupled to a power source;
(d) a second amplifier-branch control switch coupled to the second power supply terminal and configured to be coupled to the power source; and
(e) a source switch coupled between the respective first and second source switch terminals of the first and second cascode amplifier branches and configured to connect the coupled first and second source switch terminals if only one of the first and second cascode amplifier branches is enabled, and to disconnect the coupled first and second source switch terminals if both of the first and second cascode amplifier branches are enabled.

12. The amplifier of claim 11, wherein the first and second cascode amplifier branches each have an amplifying ON mode of operation and a non-amplifying OFF mode of operation.

13. The amplifier of claim 12, wherein the first and second cascode amplifier branches may concurrently be in the amplifying ON mode of operation.

14. The amplifier of claim 11, wherein:
(a) in a first mode of operation, the first amplifier-branch control switch connects the power source to the first power supply terminal to enable the first amplifier branch, and the second amplifier-branch control switch disconnects the power source from the second power supply terminal to disable the second cascode amplifier branch;
(b) in a second mode of operation, the second amplifier-branch control switch connects the power source to the second power supply terminal to enable the second amplifier branch, and the first amplifier-branch control switch disconnects the power source from the first power supply terminal to disable the first cascode amplifier branch; and
(c) in a third mode of operation, the first amplifier-branch control switch connects the power source to the first power supply terminal to enable the first amplifier branch, and the second amplifier-branch control switch connects the power source to the second power supply terminal to enable the second amplifier branch.

15. The amplifier of claim 11, wherein each FET has a gate oxide layer and wherein the respective gate oxide layers of the FETs have essentially the same thickness.

16. The amplifier of claim 11, wherein:
(a) the first amplifier-branch control switch and the second amplifier-branch control switch are FETs each including a gate oxide layer having a first thickness; and
(b) the first and second output FETs each include a thickness gate oxide layer having a second thickness that is thinner than the first thickness.

17. The amplifier of claim 11, wherein the first amplifier-branch control switch and the second amplifier-branch control switch are FETs capable of withstanding more voltage than the first and second output FETs.

18. The amplifier of claim 11, wherein:
(a) the first amplifier-branch control switch and the second amplifier-branch control switch are FETs capable of withstanding a first OFF-state drain-to-source voltage $V_{DS}$; and
(b) the first and second output FETs are capable of withstanding a second OFF-state drain-to-source voltage $V_{DS}$ less than the first OFF state drain-to-source voltage $V_{DS}$.

19. The amplifier of claim 11, wherein a first bias voltage applied to the first bias terminal and a second bias voltage applied to the second bias terminal remain applied regardless of an enabled or disabled state of the corresponding cascode amplifier branch.

20. The amplifier of claim 19, wherein a difference between the first and second bias voltages and a voltage of the power source is less than or equal to about 1 volt.

* * * * *